(12) United States Patent
Kim

(10) Patent No.: US 7,379,488 B2
(45) Date of Patent: May 27, 2008

(54) EXTERNAL CAVITY DUAL WAVELENGTH LASER SYSTEM

(75) Inventor: Taek Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 168 days.

(21) Appl. No.: 10/960,698

(22) Filed: Oct. 8, 2004

(65) Prior Publication Data
US 2005/0281308 A1    Dec. 22, 2005

(30) Foreign Application Priority Data
Jun. 19, 2004   (KR) .................. 10-2004-0045848

(51) Int. Cl.
H01S 3/08    (2006.01)
H01S 3/10    (2006.01)
H01S 3/091   (2006.01)

(52) U.S. Cl. ................ 372/99; 372/23; 372/70; 372/50.124

(58) Field of Classification Search .............. 372/21, 372/22, 23, 50.121, 50.124, 69, 70, 72, 92, 372/97, 98–99
See application file for complete search history.

(56) References Cited

U.S. PATENT DOCUMENTS

| | | | |
|---|---|---|---|
| 6,243,407 B1 | 6/2001 | Mooradian | |
| 6,327,295 B1 | 12/2001 | Yamashita et al. | |
| 6,347,109 B1 | 2/2002 | Beach et al. | |
| 6,370,168 B1 | 4/2002 | Spinelli | |
| 6,393,038 B1 * | 5/2002 | Raymond et al. | 372/22 |
| 6,535,541 B1 | 3/2003 | Boucart et al. | |
| 6,546,038 B1 * | 4/2003 | Mizuno | 372/96 |
| 6,567,434 B2 * | 5/2003 | Spinelli et al. | 372/22 |
| 6,614,827 B1 | 9/2003 | Mooradian | |
| 6,778,582 B1 * | 8/2004 | Mooradian | 372/97 |
| 6,959,025 B2 * | 10/2005 | Jikutani et al. | 372/46.01 |
| 2002/0172237 A1 | 11/2002 | Murry et al. | |
| 2003/0012247 A1 * | 1/2003 | Chilla | 372/93 |
| 2003/0156617 A1 | 8/2003 | Baney et al. | |
| 2004/0076204 A1 * | 4/2004 | Kruschwitz et al. | 372/39 |
| 2004/0233961 A1 * | 11/2004 | Lutgen | 372/70 |
| 2007/0274361 A1 * | 11/2007 | Calvez et al. | 372/50.1 |

FOREIGN PATENT DOCUMENTS

| | | |
|---|---|---|
| EP | 1411608 A2 | 4/2004 |
| WO | 02/47223 A1 | 6/2002 |
| WO | 2004/086577 A2 | 10/2004 |

OTHER PUBLICATIONS

C.P. Lee et al., "Dual-wavelength Bragg reflectors using GaAs/AlAs multilayers", Electronics Letters, vol. 29, Issue 22, Oct. 28, 1993, pp. 1980-1981.

(Continued)

Primary Examiner—Minsun Oh Harvey
Assistant Examiner—Phillip Nguyen
(74) Attorney, Agent, or Firm—Buchanan Ingersoll & Rooney PC

(57) ABSTRACT

The number and type of quantum wells in a multi-layer gain structure of an external cavity surface emitting laser (VEC-SEL) are controlled to provide output light of more than one coherent wavelength. The number and type of layers in a multiplayer mirror provides a dual wavelength reflector.

38 Claims, 6 Drawing Sheets

OTHER PUBLICATIONS

Stephane Calvez et al., "Optimization of an Optically Pumped 1.3-μm GainNAs Vertical-Cavity Surface-Emitting Laser", Photonics Technology Letters, IEEE, vol. 14, Issue 2, Feb. 2002, pp. 131-133.

Mark Kuznetsov et al., "Design and Characteristics of High-Power (>0.5-WCW) Diode-Pumped Vertical-External-Cavity Surface-Emitting Semiconductor Lasers with Circular $TEM_{00}$ Beams", IEEE Journal of Selected Topics in Quantam Electronics, vol. 5., No. 3, May/Jun. 1999, pp. 561-573.

Chinese Office Action issued by the Chinese Patent Office on Nov. 9, 2007 in corresponding Chinese Application No. 2005100778042 and the English translation thereof.

* cited by examiner

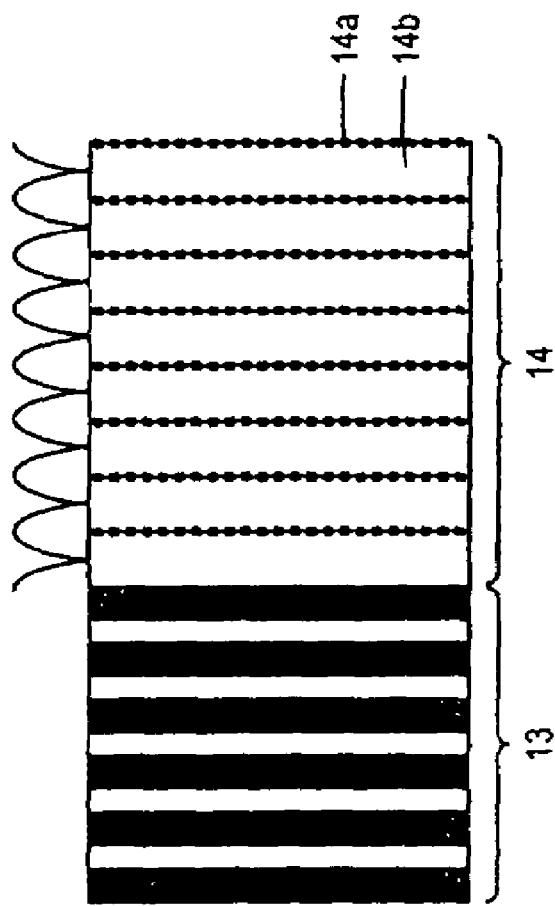
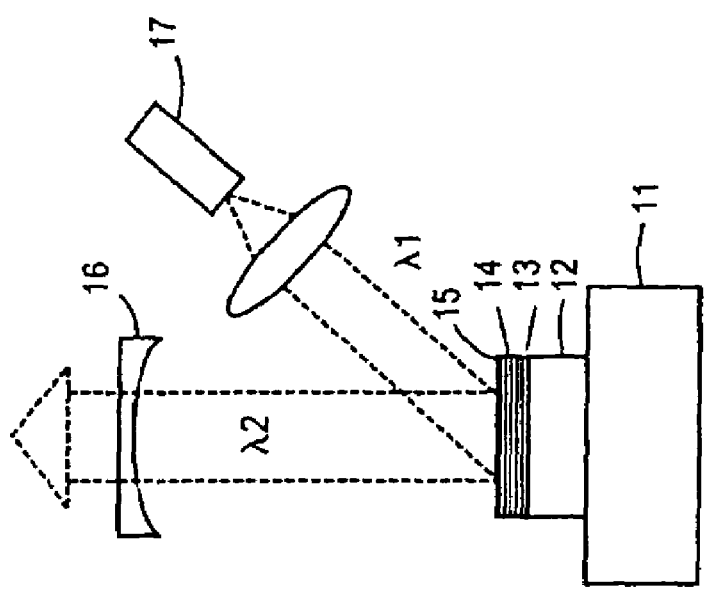

EXTERNAL CAVITY DUAL WAVELENGTH LASER SYSTEM

Priority is claimed to Korean Patent Application No. 2004-45848 filed on Jun. 19, 2004, in Korean Intellectual Property Office, the disclosure of which is incorporated herein in its entirety by reference.

BACKGROUND OF THE INVENTION

1. Field of the Invention

The present invention relates to a laser system capable of emitting two or more coherent wavelengths of light, and more particularly to both optically pumped and electrically pumped semiconductor vertical external cavity surface emitting lasers (VECSEL) with selectively positioned quantum wells to control the power of light at each of said wavelengths.

2. Description of the Related Art

There is an increasing need for multiple wavelength laser sources. For instance, the increased popularity of laser display devices presents a need for a red (R)(~625 nm), green (G)(~532 nm) and blue (B)(~460 nm) laser source. Currently, the present inventors know of no available semiconductor lasers that emit both blue and green wavelengths.

Diode pumped solid state (DPSS) lasers combined with second harmonic generation (SHG) technology can provide green laser light at 532 nm, but such devices are relatively expensive at this time. High power blue laser light is still very difficult to achieve, due to low recombination efficiency.

Infrared wavelength, optically pumped semiconductor (OPS) vertical external (or coupled) cavity surface emitting lasers (VECSEL), such as disclosed in U.S. Pat. No. 6,347,109, can provide a visual wavelength laser beam with SHG technology, such as disclosed in U.S. Pat. No. 6,370,168. Similarly, electrically pumped VECSELs, such as disclosed in U.S. Pat. Nos. 6,614,827 and 6,243,407, can provide a visual wavelength laser beam with SHG technology. Each of these patents is herein incorporated by reference.

Generally, OPS-VECSELs conceptually combine the approaches of diode-pumped solid-state lasers and semiconductor quantum-well (QW) vertical-cavity surface-emitting lasers (VCSEL). In these approaches, a semiconductor chip of the laser system is composed of a QW active layer and a highly reflective distributed Bragg reflector (DBR). Usually the QW active layer is designed to enhance gain performance to achieve high power, such as provided by a resonant periodic gain (RPG) structure, such as disclosed by Mark Kuznetsov et al., "Design and Characteristics of High-Power (>0.5-W CW) Diode-Pumped Vertical-External-Cavity Surface-Emitting Semiconductor Lasers with Circular TEM$_{00}$ Beams," IEEE J. of Selected Topics in Quantum Electronics, Vol. 5, No. 3, May/June 1999.

FIG. 1 is a simplified cross-section of a conventional VECSEL, such as disclosed in U.S. Pat. No. 6,370,168. Referring to FIG. 1, the conventional VECSEL 10 includes a heat sink 11 attached to a chip. The chip includes a substrate 12 upon which are stacked a lower, high reflectivity multi-layer mirror 13, such as a semiconductor layer of distributed Bragg reflectors (DBR), a gain region 14, such as a multi-quantum well gain region with a resonant periodic gain (RPG), and an upper anti-reflective coating 15. A lasing cavity is formed between an external spherical mirror 16, through which part of the laser beam λ2 can pass as the laser output, and the high-reflectivity mirror 13 of the chip. A pump beam from a multi-mode laser source 17 of a different wavelength λ1 is projected onto the anti-reflective coating 15. An optical non-linear crystal (not shown) can be added to double the frequency of the lasing light λ2.

Referring to FIG. 2, the structure of the conventional DBR 13 and RPG active region 14 is shown in relation to the standing wave of the cavity structure. As can be seen, the RPG 14 is made up of QWs 14a and spacers 14b. The QWs 14a are positioned at the antinodes of the standing wave to maximize gain in the pumped laser light λ2 through in-quantum-well absorption of the pumping laser light λ1, which is favored to avoid excessive heat generation. Light generated from this active region 14 of a conventional VECSEL is projected through the external mirror 16 as a continuous wave (CW) laser light output.

In approaches such as these, the pump diode laser 17 (in the case of optical pumping), the cooling element, and the optics determine the laser system price. The semiconductor chip (the substrate 12, the DBR 13, the RPG 14 and the anti-reflective coating 15) represents a small fraction of the total cost. These systems generate a single wavelength λ2 of laser light as the output.

SUMMARY OF THE INVENTION

The present invention provides a vertical external cavity surface emitting layer (VECSEL) system, which can produce more than one wavelength of coherent light without significantly increasing cost of manufacture or cost of operation. The semiconductor chip can be designed to emit two or more different wavelengths of light, and the rest of the laser system, representing the majority of the manufacturing cost, are used in the production of both wavelengths of light.

Embodiments of the present invention include a laser system having a laser pump structure, a laser resonator, and a pump source. The laser-resonator has a resonator axis, and is formed between the mirror structure of the laser pump structure, and an external mirror structure spaced apart from said gain-structure. The pump source is arranged to deliver pump energy to the gain-structure for generating laser-radiation in said laser-resonator. The laser pump structure includes a multi-layer gain-structure adjacent to a dual-wavelength mirror-structure. The gain-structure includes a first plurality of first active layers and a second plurality of second active layers spaced apart by spacer layers. The first active layers are positioned at antinodes of a first standing wavelength of a first frequency, and second active layers are positioned at antinodes of a second standing wavelength of a second frequency. The number of first active layers and the number of second active layers are selected to control the relative power output of light at each of the first and the second wavelengths.

In some embodiments the first wavelength of the first active layers is shorter than the second wavelength of the second active layers, and more of the second active layers than the first active layers are located where antinodes of the standing waves of the first and second wavelengths coincide. In this way, the relative power of the laser light output can be balanced.

In some embodiments, mirror-structure of the laser pump structure includes a plurality of periodic heterostructures each including at least two quarterwave, high refractive layers H, at least two spacer layers S and at least one quarterwave, low refractive layer L. The multi-layer mirror can be a stack in the form of $(L(HS)^P)^N$, or in the form of $(H(LS)^P)^N$ wherein D and N are positive integers and D is greater than 1.

In still further embodiments, an optically-nonlinear crystal located in the laser-resonator is arranged to double at least one of the first frequency of laser-radiation and the second frequency of laser-radiation, thereby providing frequency-doubled radiation.

BRIEF DESCRIPTION OF THE DRAWINGS

The above and other features and advantages of the present invention will become more apparent by the following description exemplary embodiments thereof, to which the present invention is not limited, with reference to the attached drawings. It is noted that not all of possible embodiments of the present invention will exhibit each and every, or any, of the advantages described herein.

FIG. 1 is a simplified schematic diagram of a conventional vertical external cavity surface emitting laser (VECSEL).

FIG. 2 illustrates an example of a conventional RPG structure.

DETAILED DESCRIPTION OF THE INVENTION

Figure 3:
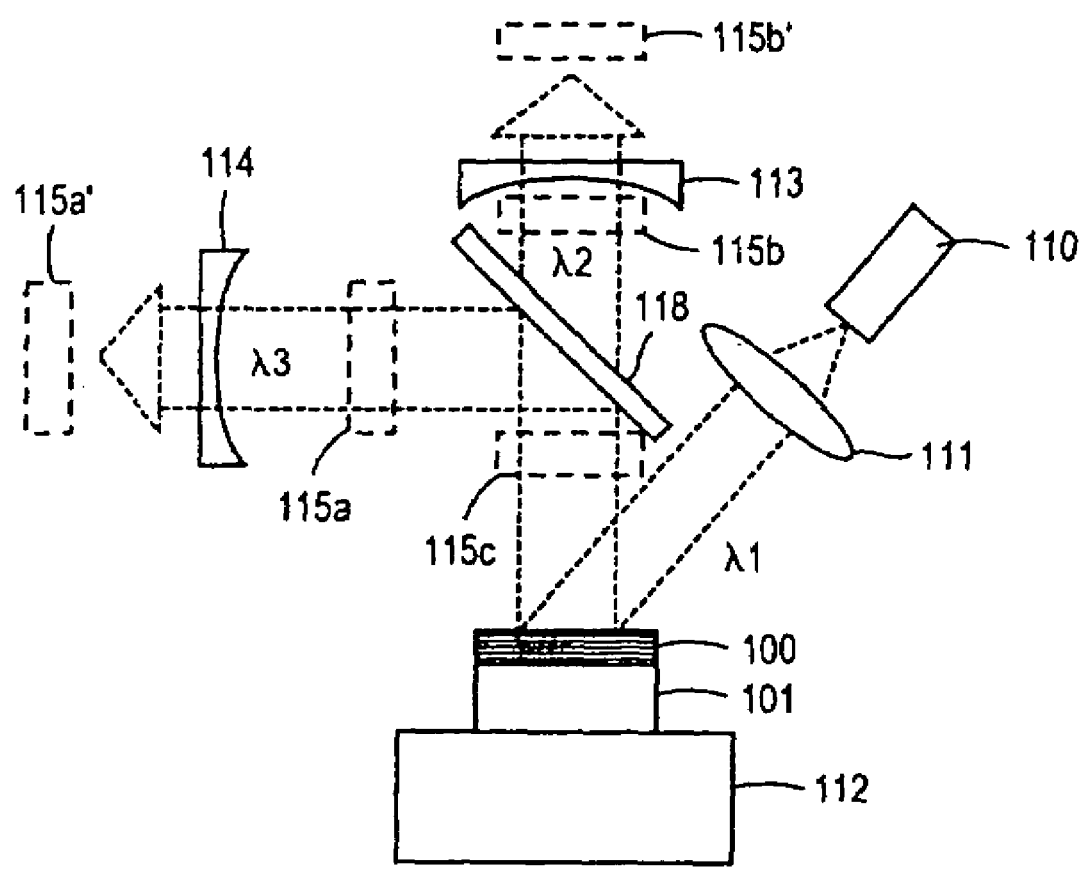
FIG. 3 is a simplified schematic diagram of an exemplary vertical external cavity surface emitting laser.

FIG. 3 schematically illustrates one example of a vertical external cavity surface-emitting laser (VECSEL). The basic VECSEL has a well-known lasing structure, which includes an active region where lasing occurs and upper and lower semiconductor layers between which the active region is located, but there are many variations of the basic structure. The present invention is not limited to this particular structure and can be adopted in a variety of different lasing structures that involve a plurality of quantum wells.

As shown in FIG. 3, the laser system in the case of an optical pumping scheme includes a pump laser diode 110, which projects laser light through a collimating lens 111 to project a collimated light beam of light at a pump wavelength $\lambda 1$ onto a laser pump structure 100. The pump light does not have to be from a diode, and does not have to be coherent light. The laser pump structure 100 is grown on a substrate 101, which in turn is mounted on a heat-sink 112. The substrate can be GaAs, or any material on which the lasing pump structure can be grown.

The laser system also includes a laser-resonator having a resonator axis and including a mirror structure 102 (FIGS. 4 and 5) of the laser pump structure 100 and an external mirror structure including first and second external mirrors 113, 114 in the illustrated embodiment, spaced apart from the gain-structure 103, and a transmissive wavelength-selective element 118.

The transmissive wavelength-selective element 118 is located in the laser-resonator for selecting the first frequency of the laser-radiation within a gain bandwidth characteristic of the composition of the gain structure 103 to pass through to the first external mirror 113 and for selecting the second frequency of the laser radiation with a gain bandwidth characteristic of the composition of the gain structure 103 to reflect to the second external mirror 114. Hence, the wavelength of light impinging on the first and second external mirrors 113, 114 is different from each other in the embodiment shown in FIG. 3. The transmissive wavelength-selective element 118 can be a dichoric mirror, a birefringent filter, an etalon, or any suitable element that separates light according to wavelength on two different paths.

It should be noted, however, that the external mirror structure can be in the form of a single external mirror 113 positioned at a distance that the end nodes of the standing waves at each wavelength are sufficiently co-located. In other words, the transmissive wavelength-selective element 118 is optional, as is the second external mirror 114 by the selection of a position of a single external mirror 113 along the resonator axis so that the two wavelengths $\lambda 2$ and $\lambda 3$ have coinciding nodes at the mirror surface so as to form coextensive standing waves of two different wavelengths.

The reflectivity of the external mirrors 113, 114 can be in the range of 98% to 99.99% for the first and second wavelengths $\lambda 2$, $\lambda 3$, with the light passing through the external mirrors 113, 114 representing the output of the exemplary laser system of FIG. 3. The external mirror structure 113, 114 can include a concave mirror to ensure single transverse mode operation. The radius of the curvature is mainly a function of cavity length and aperture diameter.

Additionally, an optically-nonlinear crystal 115 can be located to double at least one of the first frequency $\lambda 2$ or the second frequency $\lambda 3$ of the laser radiation, or both, thereby providing a frequency-doubled radiation. Optically-nonlinear crystals can be KTP, $LiNbO_3$, periodically poled $LiNbO_3$, KTN or $KnbO_3$, or any material capable of affecting the frequency of light impinging on it in a controlled and reproducible manner.

As illustrated in FIG. 3, the optically-nonlinear crystal 115 can be located within the laser-resonator such as illustrated by the phantom lines marked with reference number 115c on the resonator path common to the laser light of the first wavelength $\lambda 2$ and the second wavelength $\lambda 3$. Alternatively, the optically-nonlinear crystal 115 can be located after the transmissive wavelength-selective element 118 has separated the first wavelength light and the second wavelength light from each other. This is illustrated in FIG. 3 by the optically-nonlinear crystals shown in phantom and referenced by reference numerals 115a and 115b. This embodiment has the added advantage of being able to frequency double either the first wavelength $\lambda 2$ or the second wavelength $\lambda 3$, or both first and second wavelengths $\lambda 2$ and $\lambda 3$ by either placing or not placing the non-linear elements 115a or 115b in the relevant locations.

In still a further variation of the optically pumped laser system shown in FIG. 3, the optically-nonlinear crystal 115 can be outside the resonator either on the path of the laser radiation of the first wavelength $\lambda 2$ once it passes through the first mirror 113 as illustrated by reference number 115b', or on the optical path of the laser light having the second wavelength $\lambda 3$ after it has passed through the second mirror 114, as illustrated by reference numeral 115a'.

Figure 5:
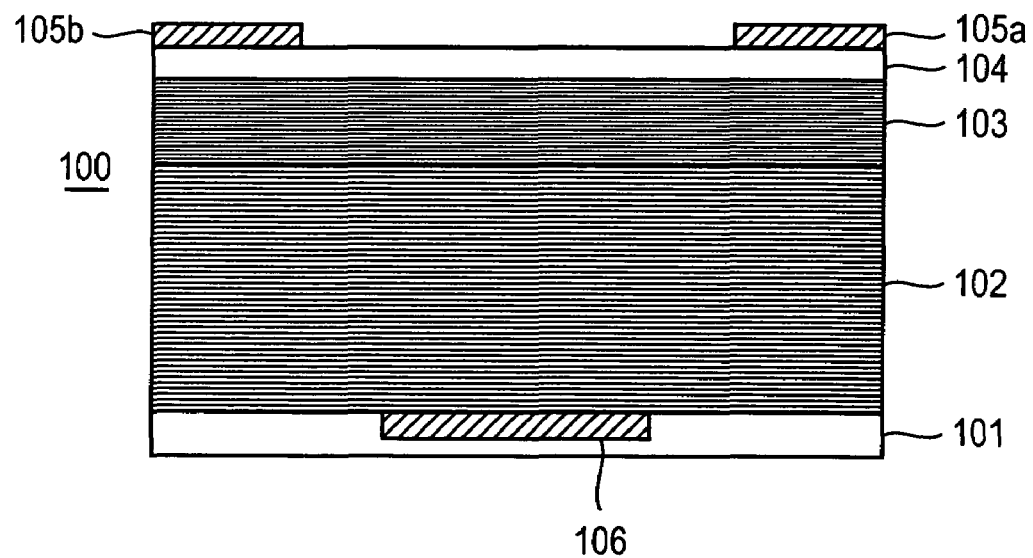
FIG. 5 is a simplified vertical cross-sectional view of an electrically-pumped chip structure according to an exemplary embodiment of the present invention.

It should also be noted that an electrically pumped laser system is substantially identical to that shown in FIG. 3, including all of the variations described above, but with a different chip structure, as shown in FIG. 5.

Figure 4:
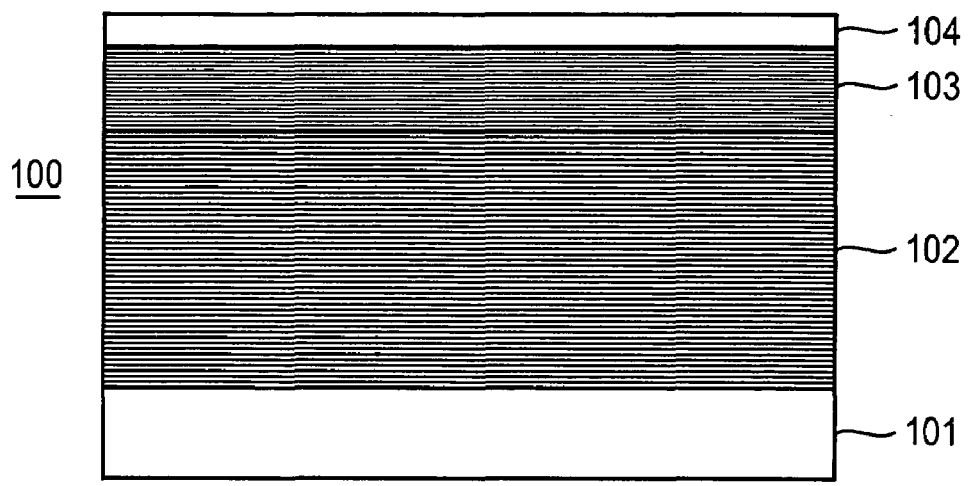
FIG. 4 is a simplified vertical cross-sectional view of an optically-pumped chip structure according to an exemplary embodiment of the present invention.

FIG. 4 illustrates a chip structure of the laser pump structure including a multilayer gain structure 103, which is mounted on or grown on a multilayer mirror structure 102. As illustrated, the mirror structure 102 is a dual band distributed Bragg reflector.

The multi-layer gain-structure 103, or active layer, is a resonant periodic gain structure. The active layer is formed of one of an indium gallium arsenide (InGaAs) quantum well, an indium gallium arsenide nitride (InGaAsN) quantum well, and an In(Ga)(N)As quantum dot.

Additionally, as illustrated in FIGS. 4 and 5, there is a substrate 101, which can be omitted in certain embodiments and a top layer 104, which can either be an anti-reflection layer or a reflective mirror. If the top layer 104 is a reflective mirror, the laser system effectively will have two resonator cavities. The first resonator cavity is located between the multilayer mirror structure 102 and the reflective mirror 104, i.e., in the multilayer gain structure 103. The second resonator, as explained above, would be between the multilayer mirror structure 102 of the gain structure 100 and the external mirror structure 113, 114.

The example illustrated in FIG. 4 is designed for optical pumping in accordance with the embodiment of FIG. 3. FIG. 5, in contrast, includes top layer contacts 105a and 105b (e.g., metal, ohmic contacts), as well as a bottom contact 106 (e.g., metal, ohmic contacts), which can be similar in structure as to the electrodes and the operation, to the laser disclosed in U.S. Pat. No. 6,614,827, for instance. In either case, whether an optical pump or an electrical pump, the pump source is arranged to deliver pump energy to the gain structure 103 for generating laser-radiation in the laser-resonator.

Figure 6:
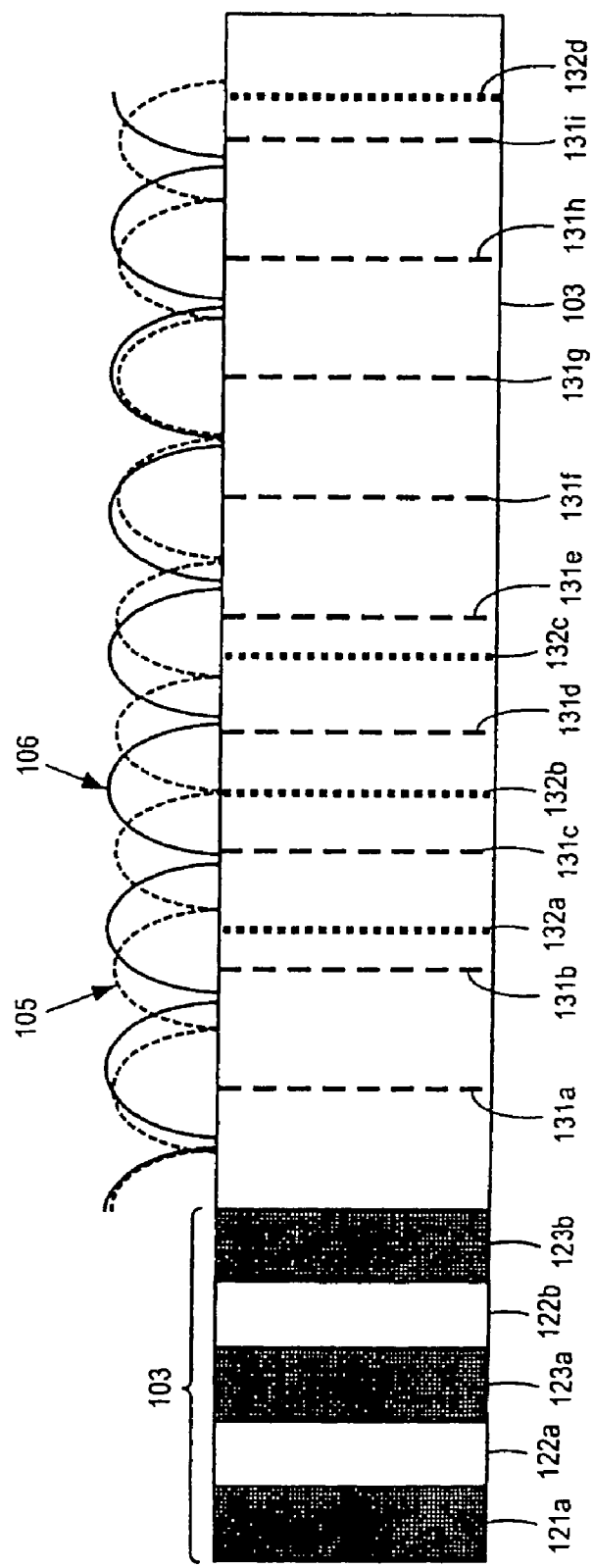
FIG. 6 illustrates an example of a RPG structure according to an exemplary embodiment of the present invention.

In FIG. 6, the laser pump structure 100 is illustrated to show the relative position of quantum wells with respect to the standing wave for two wavelengths of light.

Dual band optical reflectors are known such as disclosed in Stephane Calvez et al., "Optimization of an Optically Pumped 1.3-μm GaInNAs Vertical-Cavity Surface-Emitting Laser," IEEE Photonics Tech. Letters, Vol. 14, No. 2, February 2002 and C. P. Lee et al., "Dual-Wavelength Bragg Reflectors Using GaAs/AlAs multilayers," Electronic Letters, 28 Oct. 1993, Vol. 29, No. 22, both herein incorporated by reference. As illustrated in FIG. 6, the mirror structure 102 can be configured as a dual band distributed Bragg reflector composed of a plurality of periodic heterostructures, each comprising an equal number of layers H having a high refractive index and spacer layers S, and at least one low refractive index layer L. For clarity of illustratation, in FIG. 6 only one such heterostructure is shown, comprising low refractive index layer 121a, high refractive index layers 122a, 122b, and spacer layers 123a, 123b. Exemplary material for the high refractive index lasers H are $Al_xGa_{1-x}As$ ($0 \leq x < 1$) and exemplary material for the low refractive index lasers L are $Al_yGa_{1-y}As (0<y \leq 1)$. Exemplary material for the space layers S are $Al_zGa_{1-z}As (0<z<1)$. The layers can be formed using any suitable technique, including but not limited to MOCVD and MBE. Post-epitaxy ion implantation can be used to provide electrical confinement in electrically pumped embodiments. Lasing efficiency can be further enhanced using by employing optical confinement, such as by selective oxidation techniques to form a buried oxide aperture as is known. This provides both transverse electrical and optical confinement in $Al_xGa_{(1-x)}As$-based VCSELs and VECSELs lattice matched to GaAs substrates.

Among the novel aspect of the present invention is that the mirror structure 102 of the laser pump structure 100 is a multilayer stack in the form of $(L(HS)^D)^N$, wherein D and N are positive integers and D is greater than 1. While only low refractive index layer 121a, high refractive index layers 122a and 122b and spacer layers 123a and 123b are shown in FIG. 6, it should be noted that a larger number, for instance, 30, such layers would be utilized in a practical embodiment. Usually DBR layers end with low refractive index layer L.

Figure 7:
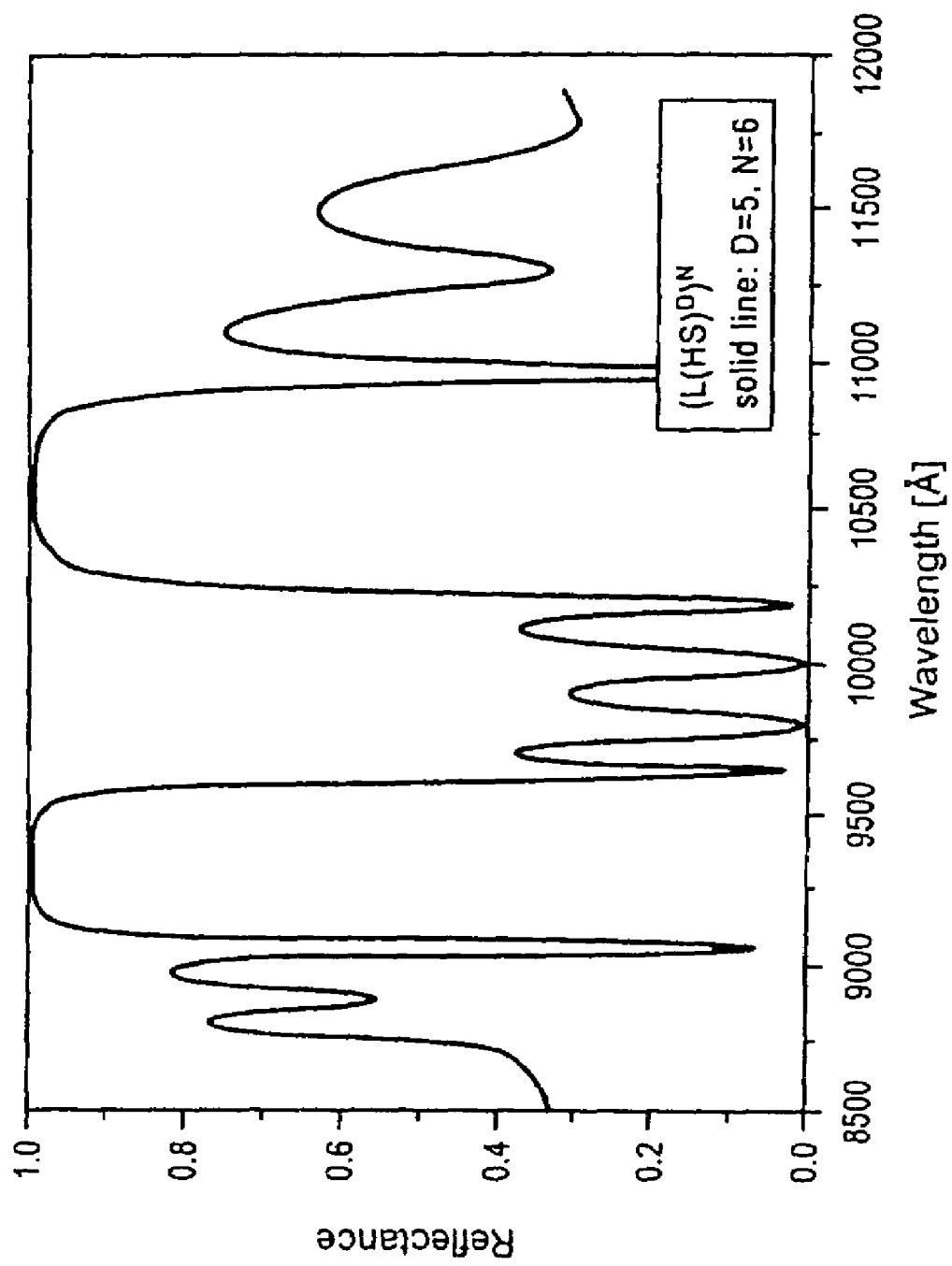
FIG. 7 is a graph showing the reflectance of a dual band high reflectivity DBR according to an exemplary embodiment of the present invention.
Figure 8:
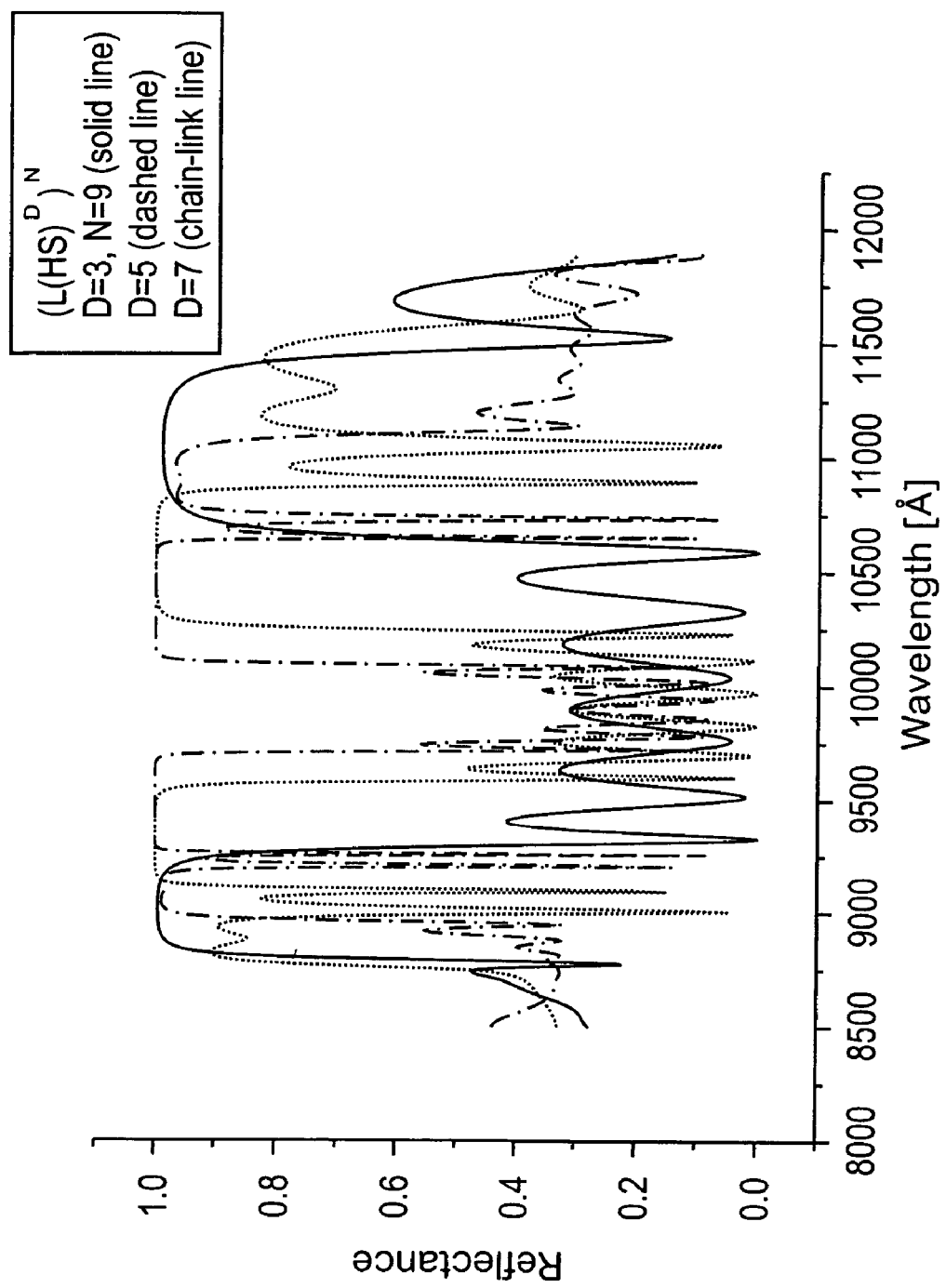
FIG. 8 is a graph showing the reflectance of a dual band high reflectivity DBR according to another exemplary embodiment of the present invention.

The number of layers in the distributed Bragg reflector has an effect on performance, as illustrated in FIGS. 7 and 8. In the graph of FIG. 7, a dual band or even a triple band high reflectivity mirror can be formed using the equation $(L(HS)^D)^N$, where D equals 5 and N equals 6 (i.e., layers in the order of LHSHSHSHSHSLHSHSHSHSHSLHSHS-HSHSHSLHSHSHSHSHSLHSHSHSHS LHSHSHS-HSHS).

FIG. 8, on the other hand, includes overlapping graphs showing the reflectance according to wavelength with the equation $(L(HS)^D)^N$, where D equals 3 and N equals 9 as the solid line, D equals 5 as to the dashed line and D equals 7 as to the chain link line.

Alternatively, the multilayer stack for the mirror structure 102 following the equation $(H(LS)^D)^N$ and where D equals 5 and N equals 6, the layers would be in the order of HLSLSLSLSLS HLSLSLSLSLS HLSLSLSLSLS HLSLSLSLSLS HLSLSLSLSLS HLSLSLSLSLS.

Turning back to FIG. 6, the resonant periodic gain structure 103 is illustrated to show the relationship between quantum wells 131, 132 and the nodes and antinodes of the standing waves. Specifically, quantum wells 131a-131i are positioned at the antinodes of the standing wave having a wavelength of 920 nm, for instance. Similarly, the quantum wells 132a-132d are positioned at the antinodes of the standing wave for a wavelength of 1060 nm.

Because part of the 920 nm light absorbs in the 1060 nm quantum wells, meaning that there is not a loss of light insofar as the light is absorbed and generates 1060 nm light, the intensity of the 1060 nm laser light can be stronger than that of the 920 nm laser light. It should be noted after review of the resonant periodic gain structure 103 that there are more quantum wells 131 for the 920 nm wavelength than the 1060 nm wavelength. The number of each type of quantum well can be controlled to control, and optionally balance the optical power of the two wavelengths. This is especially true of the quantum well in the position where there are two antinode positions that either overlap or are close to each other (e.g., ±20% of the distance between antinodes, although there is no clear criterion).

In instances where the node of the 920 nm standing wave intersects or is contiguous with a quantum well for the 1060 nm wavelengths, the quantum well, such as quantum well 132b, does not see any of the 920 nm light. If a standing wave node is co-located on a quantum well, there is no amplification. However, in other locations, the 920 nm light intersects the spaces between the quantum wells 132 and 131 and the energy thereof used to generate 1060 nm light. The intensity of the 1060 nm light can be adjusted to be stronger than it would otherwise be. It should also be noted that the barrier layers can be either absorption layers or transparent to the pumping light. The absorption of light in the barrier layer creates holes and electrons which transported to the QW contributing light generation in there. But it also creates heat. A balance should be struck insofar as the maximum light output power is limited by heat generation in current embodiments.

The present system is therefore useful even in color display devices when combined with nonlinear optical elements. The wavelengths of 920 nm and 1060 nm are common and, with frequency doubling, will result in green and blue laser lights which can be balanced relative to one another.

The active region includes an active layer 103, but can also include cladding layers between which the active layer 103 is sandwiched. The active layer 103 can include a quantum well layers and barrier layers, between which the quantum well layer is located.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser system, comprising:
a laser pump structure including a multi-layer gain-structure adjacent to a dual-wavelength mirror-structure, said gain-structure including a plurality of first active layers and a plurality of second active layers spaced apart by barrier layers;
a laser-resonator having a resonator axis, said laser-resonator formed between said mirror structure of said laser pump structure, and an external mirror structure spaced apart from said gain-structure; and
a pump source arranged to deliver pump energy to said gain-structure for generating laser-radiation in said laser-resonator,
wherein the first active layers are positioned at antinodes of a first standing wave of a first wavelength and second active layers are positioned at antinodes of a second standing wave of a second wavelength that is different from the first wavelength, wherein antinodes of the first standing wave and antinodes of the second standing wave located at different positions in the active layer,
wherein the number of first active layers and the number of second active layers control the relative power output of light at each of the first and the second wavelengths; and
wherein said first and second active layers each comprise a semiconductor material selected from the group consisting of $In_xGa_{1-x}As_yP_{1-y}$, $In_xGa_{1-x}As$, $Ga_xIn_{1-x}N_yAs_{1-y}$ and $Ga_{1-x}As_ySb$ where $0.0 < x < 1.0$ and $0.0 < y < 1.0$, x and y being independently selectable for each of the first and second active layers.

2. The laser of claim 1, wherein said first wavelength of said first active layers is shorter than said second wavelength of said second active layers, and more of said second active layers than said first active layers are located where antinodes of said standing waves of said first and second wavelengths coincide.

3. The laser of claim 1, wherein said pump source is a pump-light source arranged to deliver pump-radiation to said gain-structure for generating laser-radiation in said laser-resonator.

4. The laser of claim 1, wherein said pump source is a pump-electron source arranged to deliver pump-electrons to said gain-structure for generating laser-radiation in said laser-resonator.

5. The laser of claim 1, wherein said first active layers of said gain-structure are layers of a semiconductor material having a composition $In_{0.1}Ga_{0.9}As$ and said first wavelength is 920 nm.

6. The laser of claim 1, wherein said second active layers of said gain-structure are layers of a semiconductor material having a composition $In_{0.25}Ga_{0.75}As$ and said second wavelength is 1060 nm.

7. The laser of claim 1, further comprising a heat-sink in thermal contact with said laser pump structure.

8. A laser system, comprising:
a laser pump structure including a multi-layer gain-structure adjacent to a dual-wavelength mirror-structure, said gain-structure including a plurality of first active layers and a plurality of second active layers spaced apart by barrier layers;
a laser-resonator having a resonator axis, said laser-resonator formed between said mirror structure of said laser pump structure, and an external mirror structure spaced apart from said gain-structure; and
a pump source arranged to deliver pump energy to said gain-structure for generating laser-radiation in said laser-resonator,
wherein the first active layers are positioned at antinodes of a first standing wave of a first wavelength and second active layers are positioned at antinodes of a second standing wave of a second wavelength that is different from the first wavelength, wherein antinodes of the first standing wave and antinodes of the second standing wave located at different positions in the active layer,
wherein the number of first active layers and the number of second active layers control the relative power output of light at each of the first and the second wavelengths, and
wherein said mirror-structure of said laser pump structure includes a plurality of periodic heterostructures each comprising at least two high refractive layers H, at least two spacer layers S and at least one low refractive layers L.

9. The laser of claim 8, wherein said multi-layer mirror is a stack in the form of $(L(HS)^D)^N$, wherein D and N are positive integers and D is greater than 1.

10. The laser of claim 8, wherein said multi-layer mirror is a stack in the form of $(H(LS)^D)^N$, wherein D and N are positive integers and D is greater than 1.

11. A laser system, comprising:
a laser pump structure including a multi-layer gain-structure adjacent to a dual-wavelength mirror-structure, said gain-structure including a plurality of first active layers and a plurality of second active layers spaced apart by barrier layers;
a laser-resonator having a resonator axis, said laser-resonator formed between said mirror structure of said laser pump structure, and an external mirror structure spaced apart from said gain-structure; and
a pump source arranged to deliver pump energy to said gain-structure for generating laser-radiation in said laser-resonator,
wherein the first active layers are positioned at antinodes of a first standing wave of a first wavelength and second active layers are positioned at antinodes of a second standing wave of a second wavelength that is different from the first wavelength, wherein antinodes of the first standing wave and antinodes of the second standing wave located at different positions in the active layer, and
wherein the number of first active layers and the number of second active layers control the relative power output of light at each of the first and the second wavelengths; and
further comprising an optically-nonlinear crystal located in said laser-resonator, and arranged to double at least one of said first frequency of laser-radiation and said second frequency of laser-radiation, thereby providing frequency-doubled radiation.

12. A laser system, comprising:
a laser pump structure including a multi-layer gain-structure adjacent to a dual-wavelength mirror-structure, said gain-structure including a plurality of first active layers and a plurality of second active layers spaced apart by barrier layers;
a laser-resonator having a resonator axis, said laser-resonator formed between said mirror structure of said laser pump structure, and an external mirror structure spaced apart from said gain-structure; and
a pump source arranged to deliver pump energy to said gain-structure for generating laser-radiation in said laser-resonator,
wherein the first active layers are positioned at antinodes of a first standing wave of a first wavelength and second active layers are positioned at antinodes of a second standing wave of a second wavelength that is different from the first wavelength, wherein antinodes of the first standing wave and antinodes of the second standing wave located at different positions in the active layer,
wherein the number of first active layers and the number of second active layers control the relative power output of light at each of the first and the second wavelengths, and
wherein said external mirror structure includes a first external mirror, a second external mirror and a transmissive wavelength-selective element located in said laser-resonator for selecting said first wavelength of said gain-structure to reach the first external mirror and for selecting said second wavelength of said gain-structure to reach the second external mirror.

13. The laser of claim 12, further comprising an optically-nonlinear crystal located in said laser-resonator between said transmissive wavelength-selective element and said first mirror and arranged to double a first frequency of said first wavelength laser radiation, thereby providing frequency-doubled radiation.

14. The laser of claim 12, further comprising an optically-nonlinear crystal located in said laser-resonator between said transmissive wavelength-selective element and said second mirror and arranged to double a second frequency of said second wavelength laser radiation, thereby providing frequency-doubled radiation.

15. The laser of claim 12, further comprising an optically-nonlinear crystal located outside said laser-resonator, and arranged to double at least one of a first frequency of laser radiation and a second frequency of laser radiation, thereby providing frequency-doubled radiation.

16. The laser of claim 12, further comprising an optically-nonlinear crystal located in said laser-resonator between said transmissive wavelength-selective element and said a multi-layer mirror-structure and arranged to double at least one of a first frequency of said first wavelength laser radiation and a second frequency of said second wavelength laser radiation, thereby providing frequency-doubled radiation.

17. A laser system, comprising:
a laser pump structure including a multi-layer gain-structure adjacent to a dual-wavelength mirror-structure, said gain-structure including a plurality of first active layers and a plurality of second active layers spaced apart by barrier layers;
a laser-resonator having a resonator axis, said laser-resonator formed between said mirror structure of said laser pump structure, and an external mirror structure spaced apart from said gain-structure; and
a pump source arranged to deliver pump energy to said gain-structure for generating laser-radiation in said laser-resonator,
wherein the first active layers are positioned at antinodes of a first standing wave of a first wavelength and second active layers are positioned at antinodes of a second standing wave of a second wavelength that is different from the first wavelength, wherein antinodes of the first standing wave and antinodes of the second standing wave located at different positions in the active layer,
wherein the number of first active layers and the number of second active layers control the relative power output of light at each of the first and the second wavelengths, and
wherein the first and the second wavelengths generated by the first and second active layers and have values of about 1060 and 920 nanometers, respectively.

18. A laser system, comprising:
a laser pump structure including a multi-layer gain-structure adjacent a multi-layer mirror-structure, said gain-structure including a plurality of first active layers generating light at a first frequency and a plurality of second active layers generating light at a second frequency that is different from the first frequency, said first and second active layers being spaced apart by barrier layers;
a laser-resonator having a resonator axis, said laser-resonator formed between said mirror structure of said laser pump structure, and an external mirror structure spaced apart from said gain-structure; and
a pump source arranged to deliver pump energy to said gain-structure for generating laser-radiation in said laser-resonator,
wherein said multi-layer mirror-structure of said laser pump structure includes a plurality of periodic hetero-structures each comprising at least two high refractive layers H, at least two spacer layers S and at least one low refractive layer L.

19. The laser of claim 18, wherein said multi-layer mirror is a stack in the form of $(L(HS)^D)^N$, wherein D and N are positive integers and D is greater than 1.

20. The laser of claim 18, wherein said multi-layer mirror is a stack in the form of $(H(LS)^D)^N$ wherein D and N are positive integers and D is greater than 1.

21. The laser of claim 18, further comprising an optically-nonlinear crystal located in said laser-resonator, and arranged to double at least one of a first frequency of laser-radiation and a second frequency of laser-radiation, thereby providing frequency-doubled radiation.

22. The laser of claim 18, wherein said external mirror structure includes a first external mirror, a second external mirror and a transmissive wavelength-selective element located in said laser-resonator for selecting said first wavelength of said gain-structure to reach the first external mirror and for selecting said second wavelength of said gain-structure to reach the second external mirror.

23. The laser of claim 22, further comprising an optically-nonlinear crystal located in said laser-resonator between said transmissive wavelength-selective element and said first mirror and arranged to double a first frequency of said first wavelength laser radiation, thereby providing frequency-doubled radiation.

24. The laser of claim 22, further comprising an optically-nonlinear crystal located in said laser-resonator between said transmissive wavelength-selective element and said second mirror and arranged to double a second frequency of said second wavelength laser radiation, thereby providing frequency-doubled radiation.

25. The laser of claim 22, further comprising an optically-nonlinear crystal located outside said laser-resonator, and arranged to double at least one of said first frequency of laser radiation and said second frequency of laser radiation, thereby providing frequency-doubled radiation.

26. The laser of claim 22, further comprising an optically-nonlinear crystal located in said laser-resonator between said transmissive wavelength-selective element and said a multi-layer mirror-structure and arranged to double at least one of a first frequency of said first wavelength laser radiation and a second frequency of said second wavelength laser radiation, thereby providing frequency-doubled radiation.

27. The laser of claim 18, wherein said pump source is a pump-light source arranged to deliver pump-radiation to said gain-structure for generating laser-radiation in said laser-resonator.

28. The laser of claim 18, wherein said pump source is a pump-electron source arranged to deliver pump-electrons to said gain-structure for generating laser-radiation in said laser-resonator.

29. The laser of claim 18, wherein said first and second active layers each comprise a semiconductor material selected from the group consisting of $In_x Ga_{1-x}As_yP_{1-y}$, $In_xGa_{1-x}As$, $Ga_xIn_{1-x}N_yAs_{1-y}$, and $Ga_{1-x}As_ySb$ where $0.0<x<1.0$ and where $0.0<y<1.0$, x and y being independently selectable for the first and second active layers.

30. The laser of claim 18, wherein a first and a second wavelengths generated by the first and second active layers have a values of about 1060 and 920 nanometers, respectively.

31. The laser of claim 18, wherein said first active layers of said gain-structure comprise a semiconductor material having a composition In0.1Ga0.9As and generate light at a first wavelength of 920 nm.

32. The laser of claim 18, wherein said second active layers of said gain-structure comprise a semiconductor material having a composition $In_{0.25}Ga_{0.75}As$ and generate light at a second wavelength of 1060 nm.

33. The laser of claim 18, further comprising a heat-sink in thermal contact with said laser pump structure, said heat-sink being of a material having a thermal expansion coefficient which matches the thermal expansion coefficient of said laser pump structure.

34. A pumped laser system, comprising:
a substrate;
a distributed Bragg reflector with a double band high reflectivity, said distributed Bragg reflector being located on said substrate and includes a plurality of periodic heterostructures each comprising at least two high refractive layers H, at least two spacers S and at least one low refractive layer L;
active layers which emit two different wavelengths, said active layers being located on said distributed Bragg reflector;
a pump source arranged to energize said active layers to produce coherent light;
antireflection layer located on said active layers; and
a highly reflective external mirror.

35. The laser system of claim 34, wherein said pump source is an electron source and said laser system further comprises ohmic contacts located to inject electrons into said active layers.

36. The laser system of claim 35, further comprising a current confinement structure.

37. The laser system of claim 34, wherein said pump source is an optical light source.

38. The laser system of claim 34, wherein said substrate is a GaAs substrate and said distributed Bragg reflector with a double band high reflectivity including $Al_xGa_{1-x}As$ layers and $Al_yGa_{1-y}As$ layers, where $0.0 \leq x<1.0$ and $0.0<y \leq 1.0$.

* * * * *